United States Patent
Steinkogler et al.

(10) Patent No.: US 11,294,037 B2
(45) Date of Patent: Apr. 5, 2022

(54) DETECTING LIGHT USING A PLURALITY OF AVALANCHE PHOTODIODE ELEMENTS

(71) Applicant: SICK AG, Waldkirch (DE)

(72) Inventors: Sascha Steinkogler, Waldkirch (DE); Martin Marra, Waldkirch (DE); Klaus Clemens, Waldkirch (DE)

(73) Assignee: SICK AG, Waldkirch (DE)

( * ) Notice: Subject to any disclaimer, the term of this patent is extended or adjusted under 35 U.S.C. 154(b) by 385 days.

(21) Appl. No.: 16/535,426

(22) Filed: Aug. 8, 2019

(65) Prior Publication Data

US 2020/0057146 A1    Feb. 20, 2020

(30) Foreign Application Priority Data

Aug. 17, 2018 (DE) .......................... 102018120141.9

(51) Int. Cl.
*G01S 7/481* (2006.01)
*G01J 1/44* (2006.01)
*G01S 17/10* (2020.01)

(52) U.S. Cl.
CPC .............. *G01S 7/4816* (2013.01); *G01J 1/44* (2013.01); *G01S 17/10* (2013.01); *G01J 2001/4406* (2013.01); *G01J 2001/448* (2013.01); *G01J 2001/4466* (2013.01)

(58) Field of Classification Search
CPC ........ G01S 7/4816; G01S 17/10; G01S 17/18; G01S 7/487; G01S 17/42; G01S 7/4865; G01S 7/497; G01S 17/894; G01S 7/4863; G01S 7/4817; G01S 7/486; G01J 1/44; G01J 2001/4406; G01J 2001/4466; G01J 2001/448; G01J 1/4228; H01L 31/02027
See application file for complete search history.

(56) References Cited

U.S. PATENT DOCUMENTS

| | | | | |
|---|---|---|---|---|
| 2017/0179173 | A1* | 6/2017 | Mandai | ............ H01L 27/14643 |
| 2018/0180470 | A1 | 6/2018 | Seitz | |
| 2019/0181177 | A1* | 6/2019 | Kobayashi | ........ H01L 27/14634 |

FOREIGN PATENT DOCUMENTS

| | | | | |
|---|---|---|---|---|
| DE | 202013101039 U1 | 4/2014 | | |
| DE | 102014207599 A1 * | 10/2015 | ............ | G01J 1/4228 |
| DE | 102014207599 A1 | 10/2015 | | |
| DE | 112015001704 T5 | 12/2016 | | |

(Continued)

OTHER PUBLICATIONS

Corresponding DE Office Action dated Jun. 17, 2019 for 102018120141.9.

*Primary Examiner* — Thanh Luu
*Assistant Examiner* — Monica T Taba
(74) *Attorney, Agent, or Firm* — Nath, Goldberg & Meyer; Jerald L. Meyer

(57) ABSTRACT

A light receiver (22) is provided having a plurality of avalanche photodiode elements (24) that can each be biased above a breakdown voltage by a bias voltage and can thus be operated in a Geiger mode, wherein the avalanche photodiode elements (24) form a plurality of groups, and having a control unit (30) to change the sensitivity of the avalanche photodiode elements (24) of a respective group. In this respect, the control unit (30) is configured to respectively change the sensitivity of the avalanche photodiode elements (24) of a group at at least one point in time assigned to the group, with different points in time being assigned to the groups.

19 Claims, 5 Drawing Sheets

(56) References Cited

FOREIGN PATENT DOCUMENTS

Figure 1:
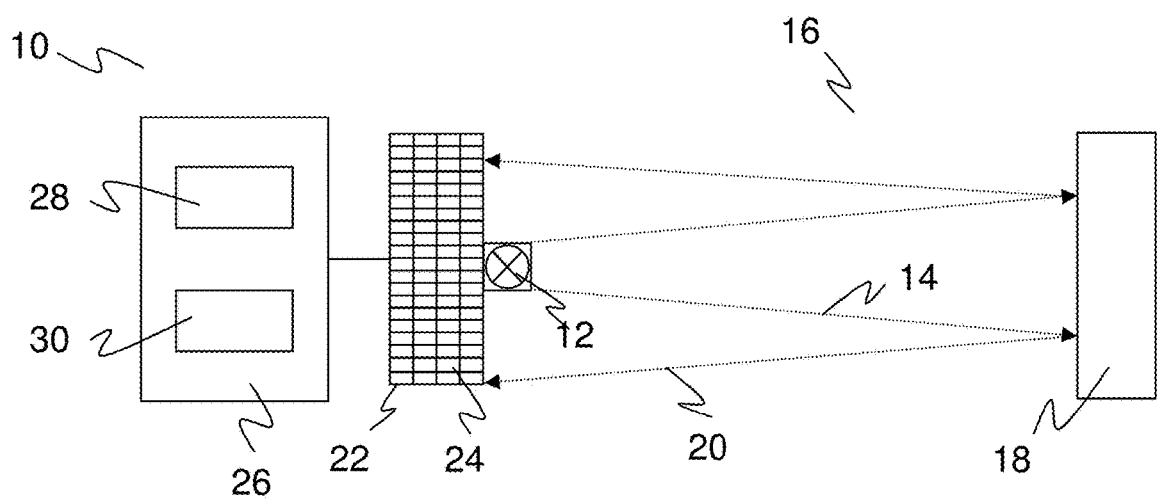

| EP | 2708914 | A1 | 3/2014 |
| EP | 3270182 | A1 | 1/2018 |
| EP | 3339887 | A1 | 6/2018 |
| JP | 2016225453 | A | 12/2016 |

* cited by examiner

DETECTING LIGHT USING A PLURALITY OF AVALANCHE PHOTODIODE ELEMENTS

The invention relates to a light receiver having a plurality of avalanche photodiode elements that can each be biased above a breakdown voltage by a bias voltage and can thus be operated in a Geiger mode, wherein the avalanche photodiode elements form a plurality of groups, and having a control unit to change the sensitivity of the avalanche photodiode elements of a respective group. The invention further relates to a method of detecting light using a plurality of avalanche photodiode elements that are each operated at least phase-wise at a bias voltage above a breakdown voltage and thus in a Geiger mode, wherein the avalanche photodiode elements form a plurality of groups and the sensitivity of the avalanche photodiode elements of a respective group is changed.

A light receiver has the function of generating an electrical signal from incident received light. The detection sensitivity of simple photodiodes is not sufficient in a number of application cases. In an avalanche photodiode (APD), the incident light triggers a controlled avalanche effect. The charge carriers generated by incident photons are thus multiplied and a photocurrent is produced that is proportional to the received light intensity, but that is in this respect substantially larger than with a simple PIN diode. In the so-called Geiger mode, the avalanche photodiode is biased above the breakdown voltage such that a single charge carrier released by a single photon can already trigger an avalanche that then recruits all the available charger carriers due to the high field strength. The avalanche photodiode thus, like the eponymous Geiger counter, counts individual events. Geiger-mode avalanche photodiodes are also called SPADs (single photon avalanche diodes).

Geiger-mode APDs or SPADs are therefore very fast, highly sensitive photodiodes based on semiconductors. A disadvantage of the high sensitivity is that not only a useful light photon, but also a weak interference event due to extraneous light, optical crosstalk or dark noise can trigger the avalanche effect. This interference event then contributes to the measurement result with the same relatively strong signal like the received useful light and cannot be distinguished therefrom, even out of the signal. The sensitivity of the avalanche photodiode is subsequently dramatically reduced for a dead time or recovery time of approximately 5 to 100 ns so that it is practically down for further measurements for so long. It is therefore customary to evaluate a plurality of SPADs statistically. A typical silicon photomultiplier (SiPM) using SPADs has several thousand SPADs.

Light receivers using SPADs are also suitable for a time of flight (TOF) measurement for a distance measurement using laser pulses. A TDC (time-to-digital) converter is here, for example, started at a transmission time point of the laser pulse and is stopped again on a reception of the laser pulse after reflection by a target object. The described dead time effect can, for example, impair the measurement capability at higher temperatures with a large number of dark events without light reception or with a large amount of extraneous light irradiation. This should in any case be taken into account in the determination of a reception time point because the measured value is otherwise falsified, particularly if the number of photons reflected back by the target object within the recovery time substantially exceeds the total number of pixels.

However, the prior art does not provide any satisfactory solution for this. EP 2 708 914 A1 discloses a SPAD-based sensor for recording a depth map in which a transmitted light beam deflected by a MEMS mirror scans the scene. Only those SPADs are respectively active on which the region of the scene illuminated by the transmitted beam is imaged. This serves for a spatial resolution by scanning, but does not improve the respective distance measurement at the scanned location in any manner.

A further sensor having avalanche photodiodes in a Geiger mode is known from EP 3 270 182 A1. Its sensitivity is dynamically adapted by the bias voltage. In an embodiment, the sensitivity is initially set as low and is then increased in accordance with the propagation speed of light. The probability that avalanche photodiodes that have not yet triggered are also available on an echo from a distant object due to the initially lower sensitivity is thus admittedly increased. However, this measure is not sufficient under unfavorable conditions, for example with a large amount of extraneous light, and falsifications of the measured value due to effects of the dead times remain completely out of consideration.

A so-called electronic diaphragm for a SPAD-based light receiver is proposed in EP 3 339 887 A1. The electronic diaphragm provides a spatial distribution of the sensitivity through a different adaptation of the bias voltage via the light receiver or a suppression of the signals of specific SPADs on reading. A checkerboard having alternatingly active and inactive SPADs is proposed as an exemplary pattern. This pattern then remains fixed and there is no further discussion on the benefit this pattern has.

DE 10 2014 207 599 A1 discloses a photodetector having a plurality of avalanche photodiodes per picture element that are activated in turn with a time offset to one another. The individual active time duration is smaller than the regeneration time; however, summed over the avalanche photodiodes of a picture element, the time durations are greater than the regeneration time so that a continuous operation is made possible. However, a larger number of avalanche photodiodes per picture element is required for this purpose. In addition, the activation sequence for all the picture elements is the same so that no flexibility remains in the spatial distribution of the respectively active avalanche photodiodes.

It is therefore the object of the invention to improve the adaptation of the avalanche photodiodes to a measurement.

This object is satisfied by a light receiver and by a method of detecting light using a plurality of avalanche photodiode elements in accordance with the respective independent claim. If a bias voltage above the breakdown voltage is applied to the avalanche photodiode elements, they operate in Geiger mode. The avalanche photodiode elements are combined into groups, with the avalanche photodiode elements of one group in particular being distributed in a pattern-like manner over the light receiver. A control unit can change the sensitivity of the avalanche photodiode elements groupwise.

The invention starts from the basic idea of adjusting the sensitivities of the groups in a time sequence. A time distribution is thus added to the spatial distribution by means of the groups. Different points in time are assigned to the groups, preferably differing in a complete manner such that no two points in time are the same. At the assigned points in time, the avalanche photodiodes of the group are set to a sensitivity associated with the point in time and/or with the group. This sensitivity can be a configuration or a stored value, but the can also be predefined by the circuit, for instance by resistance values, capacitances, and the like in the interconnection of the avalanche photodiodes. The change in the sensitivity preferably includes the extreme case of an activation or deactivation, in particular in a form such that a change takes place between the linear mode and the Geiger mode. There is a factor of $10^5$-$10^6$ in sensitivity between this, which is equal to an activation and a deactivation.

The invention has the advantage that a high flexibility and adaptability to measurement demands is achieved. Groups of avalanche photodiodes are suitably distributed over the surface for this purpose and their sensitivity is adapted in a specific time sequence. This can in particular be optimized for time of flight measurements to correct or to avoid measurement errors efficiently and inexpensively by a black-and-white displacement. In addition, the dark triggers that are alternatingly active are reduced, for example to approximately half in the case of two groups, in favor of an improved signal-to-noise ratio and a smaller power consumption.

The control unit is preferably configured to activate avalanche photodiode elements by increasing the bias voltage above the breakdown voltage and/or by decreasing the bias voltage below the breakdown voltage. The sensitivity is here not only changed gradually, but is also activated and/or deactivated by changing between the linear mode (APD mode) and the Geiger mode.

The control unit is preferably configured to change the sensitivity by an overvoltage assigned to the group above the breakdown voltage. The breakdown voltage is the minimal required bias voltage for the Geiger mode. Strictly speaking however, the photon detection efficiency (PDE) and the gain are still zero at this limit value. Incident photons are only converted into corresponding Geiger current pulses when the bias voltage exceeds the breakdown voltage, with the trigger probability increasing with the overvoltage. A gradual sensitivity control with different sensitivities of the groups is thus achieved by means of different overvoltages. It is also conceivable to provide the same group with different overvoltages and thus sensitivities at two different points in time.

A time of flight measurement unit is preferably provided that is configured to determine a time of flight of a light pulse from the signals of the avalanche photodiode elements. A reception time point derived from the signals is for this purpose preferably compared with an optically or electrically acquired reference time point of the transmission of the light pulse, for example by means of TDCs. Since a measurement event and an interference event cannot be distinguished in a single avalanche photodiode in Geiger mode, statistical processes are preferably used over a plurality of avalanche photodiodes or measurement repetitions.

The points in time preferably define at least one adaptation time window per group at whose start the control unit sets the avalanche photodiode elements to a sensitivity assigned to the group and at whose end the control unit sets the avalanche photodiode elements to the previous sensitivity. The adaptation time window is in particular an activation time window at whose start the avalanche photodiodes are activated and whose end they are deactivated. A plurality of such time windows are possible. It is alternatively conceivable to activate the groups or to set them to the desired sensitivity only in a cascaded manner by means of the points in time and not to reset them or only to reset them after a longer time, for instance together at the end of a measurement.

The points in time with respect to the different groups are preferably distributed over an event time window. The points in time are therefore staggered so that the groups, preferably regularly, share the event time window. In this respect, exactly one group is preferably active or particularly sensitive at each moment. Times of interest can alternatively be present, for instance at an expected measurement event, at which a plurality of groups are active or particularly sensitive, or conversely masking time windows can be created in which all the groups are inactive or insensitive. An example for such a masking is the front pane reflection in a time of flight measurement that unnecessarily sets avalanche photodiode elements into the dead time, which can be avoided by an inactive time interval briefly after transmission of the light pulse.

The event time window preferably has a duration corresponding to a light pulse. A time of flight is in particular measured by a light pulse and it is a very short light pulse of at most some nanoseconds in length, where possible even in the picosecond range. The event time window does not have to have exactly the duration of a light pulse; the order of magnitude is sufficient since the received pulse does not ideally correspond to the transmitted pulse.

Alternatively, the event time window corresponds to a measurement time window, for example corresponding to the duration a light pulse requires on the way to and from the limit of the range of a time of flight process. In this case, however, the received pulse is as a rule only detected in one group, at best in two groups, so that this is only a measure against general interference due to extraneous light and dark noise, but hardly improves the measurement resolution for the received pulse itself.

The sequence of the points in time is preferably periodically repeated, in particular in that a further event time window respective adjoins an event time window and is treated in the same way. The respective time windows in which a group is set to a specific sensitivity can thus remain brief and greater time periods can also nevertheless be covered with few groups by the periodic repetition.

The points in time are preferably distributed such that the avalanche photodiode elements of a different group are alternatingly particularly sensitive. The sensitive groups thus alternate with one another according to a sequence predefined by the points in time. Exactly one group is in particular respectively active, while the other groups are deactivated. There are preferably only some groups, i.e. two, three, four, five, or six to ten groups. If the groups share a typical pulse duration for a time of flight process in the order of magnitude of at most some nanoseconds, the dead time is by no means bridged after one passage through all the groups.

However, this also does not have to be the case since only the received light pulse triggers a large number of the avalanche photodiodes. The received pulse is therefore registered with even greater numbers of avalanche photodiodes that are not in their dead times due to a preferred periodic repetition of the sequence. The measurement is anyway ended after the received pulse; all the avalanche photodiodes have recovered up to a measurement repeat. At least one further population of groups could be kept available for the detection of further received pulses for a system capable of multiple targets.

The avalanche photodiode elements preferably form a matrix arrangement, with each group having an avalanche photodiode element in each matrix element in a subdivision of the matrix arrangement into a grid of matrix elements. A matrix arrangement of n×m avalanche photodiodes is here divided into a grid of a plurality of matrix elements having i×j avalanche photodiodes. At least one avalanche photodiode from each group is present in each matrix element. A comparable sensitivity thus results over the light receiver.

The avalanche photodiode elements of two groups preferably form a checkerboard pattern. Different granularities are conceivable here in which respective regions having k avalanche photodiodes belong to the same pattern element of the checkerboard. The checkerboard pattern can be understood as a special case of a grid of matrix elements having two groups, with the additional condition that the order of the setting of the sensitivities of the avalanche photodiodes reverses in respective adjacent matrix elements.

Two respective avalanche photodiodes from two different groups preferably form an at least dual avalanche photodiode having at least one front avalanche photodiode and one rear avalanche photodiode in which an avalanche effect of the front avalanche photodiode changes the sensitivity of the rear avalanche photodiode. The terms front and rear avalanche photodiodes only serve the distinction of terms and are based on a preferred time sequence. In fact, both avalanche photodiodes can be of identical designs or can swap roles. In the dual avalanche photodiode, the point in time at which the rear avalanche photodiode becomes active is automatically controlled by the triggering of the front avalanche photodiode. The avalanche effect of the front avalanche photodiode particularly preferably provides a changed bias voltage at the rear avalanche photodiode. Changes in both directions, that is a rise and a fall, are conceivable here and this change can gradually set the sensitivity by means of an adapted overvoltage or can cross the threshold of the breakdown voltage and thus effectively activate or deactivate the rear avalanche photodiode.

The sequential switching of an at least dual avalanche photodiode has a number of advantages. It effects a suppression of pixel crosstalk. Defective avalanche photodiodes that erroneously trigger can be suppressed in that the intact avalanche photodiode is operated at a higher overvoltage and the defective avalanche photodiode is only operated at the breakdown voltage. An extinction resistance that is responsible for the extinction of the avalanche on a detection event can be reduced and a higher output signal can thus be reached. The output capacity of the light receiver can specifically be reduced to a quarter by a serial connection of the front and rear avalanche photodiodes. n cells with n capacitances connected in parallel can be replaced with n/2 dual cells each having half the capacitance. It is possible to expand the concept of the dual cells to k-fold avalanche photodiodes having a chain of k avalanche photodiodes, with then a respective avalanche in an avalanche photodiode changing the sensitivity of the next avalanche photodiode in the chain. The switchover between the two avalanche photodiodes can take place electrically without interference, that is without generating interference signals on the switching procedure. The switching effort for the separate control of the second avalanche photodiode is minimal and only requires a coupling resistance, for example. The dead time or recovery time can be influenced and controlled by the selection of the coupling resistance and the capacitances. The electrical and optical crosstalk can be reduced by reducing the number of simultaneously active adjacent avalanche photodiodes.

An interconnection unit is preferably associated with the dual avalanche photodiode that maintains the front avalanche photodiode at a bias voltage above the breakdown voltage and the rear avalanche photodiode at a bias voltage below the breakdown voltage in the state of rest before an avalanche effect. A voltage divider circuit is in particular provided for this purpose that represents a very simple and inexpensive implementation option. It asymmetrically distributes a total voltage that is in an order of magnitude of twice the breakdown voltage. In the state of rest only the front avalanche photodiode is supplied above the breakdown voltage and is thus active. It becomes low ohmic on an avalanche effect so that now a higher voltage is applied to the rear avalanche photodiode that moves it over the breakdown voltage and thus into the Geiger mode and thus activates it.

Alternatively, the total voltage and the ratio are such that the front and rear avalanche photodiodes are supplied with different overvoltages and therefore gradually differ in their sensitivities, with an avalanche effect changing the ratio of the sensitivities. In a further embodiment, the avalanche effect in the one avalanche photodiode does not produce an activation, but rather conversely produces a deactivation of the other avalanche photodiode whose bias voltage is urged below the breakdown voltage. Both avalanche photodiodes are thus active in the rest state. With a strong received signal, a receiving avalanche photodiode suppresses a received signal of its partner. This prevents an overmodulation and as soon as the bias voltage of the second avalanche photodiode increases above the breakdown voltage again directly after the avalanche effect, the second avalanche photodiode is available for a further detection without any recovery time for charging.

The voltage dividers and thus the respectively applied voltages can be provided per dual avalanche photodiode, but can also be provided interconnected in parallel for a plurality of avalanche photodiodes, in particular a row or column. The division ratio can be fixed or settable by the switching elements.

A delay circuit is preferably provided that activates or deactivates the rear avalanche photodiode after a predefinable delay time after an avalanche effect in the front avalanche photodiode. The delay time can be fixed by elements of the delay circuit or it can be set by a control. The choice of the ratio of a voltage divider is one possibility of influencing the delay time for a crossing of the bias voltage via the required voltage difference.

In an advantageous further development, an optoelectronic sensor having at least one light receiver in accordance with the invention is provided, with the sensor being configured for a distance measurement and/or as a code reader and/or for data transmission. The distance can be determined by triangulation such as in a triangulation scanner or a stereo camera. Further non-exclusive applications of the light receiver in an optoelectronic sensor are code reading or data transfer or combinations of these applications in a sensor.

The sensor is particularly preferably a distance measuring sensor having a light transmitter for transmitting a light signal and having a time of flight measurement unit that is configured to determine a distance of the object from a time of flight between the transmission of the light signal and the reception of the light signal remitted from the monitored zone. The light signal preferably has a light pulse and the sensor measures distances according to the pulse method. More complicated shapes such as double pulses or even pulse codes are also conceivable here. A plurality of light pulses can also be consecutively transmitted and the respective individual results can be statistically evaluated together, for instance in a pulse averaging method. The time of flight process can be used in a one-dimensional distance scanner, a laser scanner or an image sensor of a 3D camera in accordance with the time of flight principle.

The method in accordance with the invention can be further developed in a similar manner and shows similar advantages in so doing. Such advantageous features are described in an exemplary, but not exclusive manner in the subordinate claims dependent on the independent claims.

Figure 2:
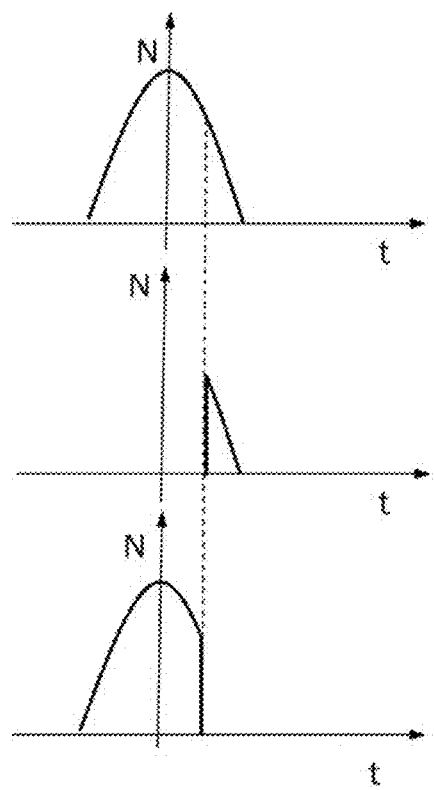
Figure 3:
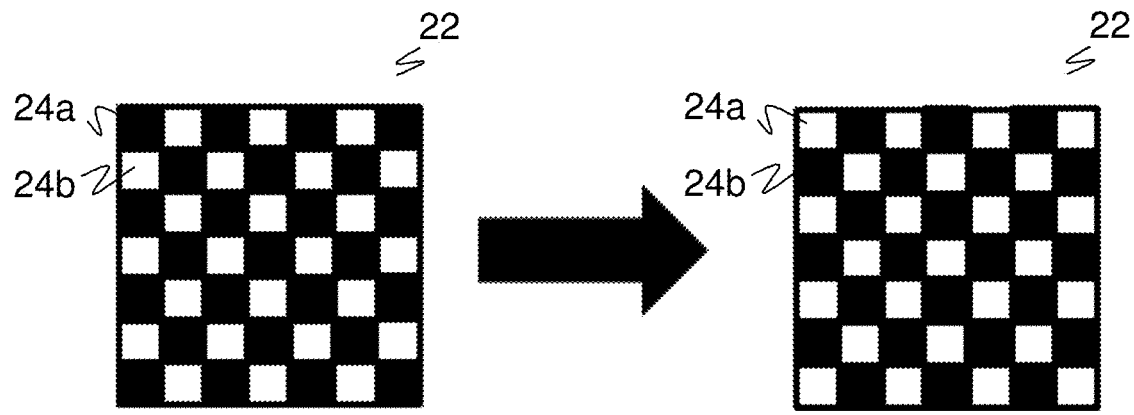
Figure 4:
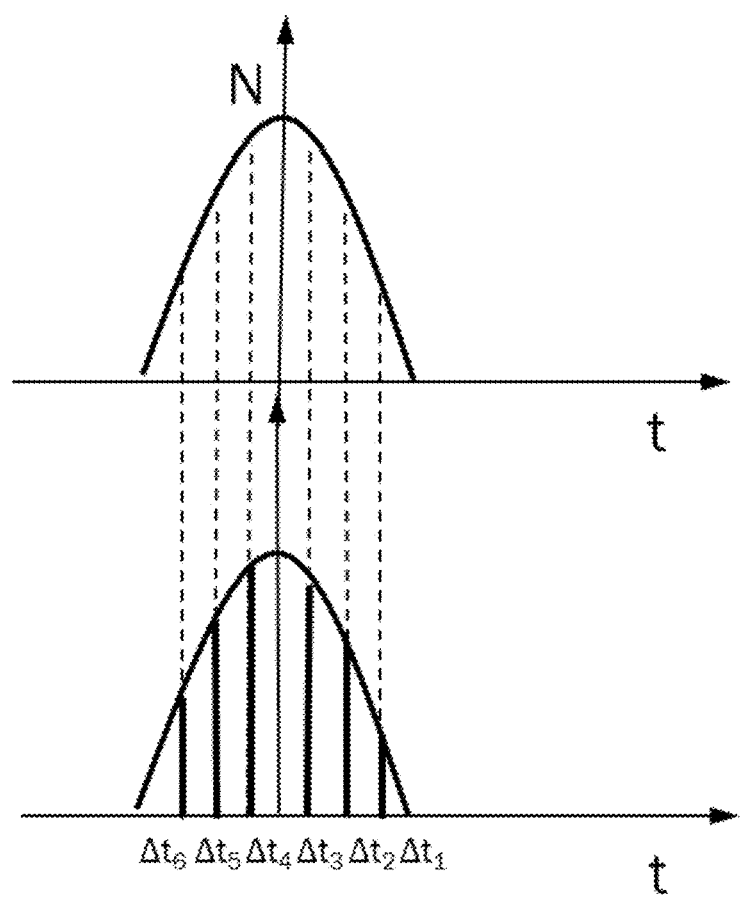
Figures 5, 6:
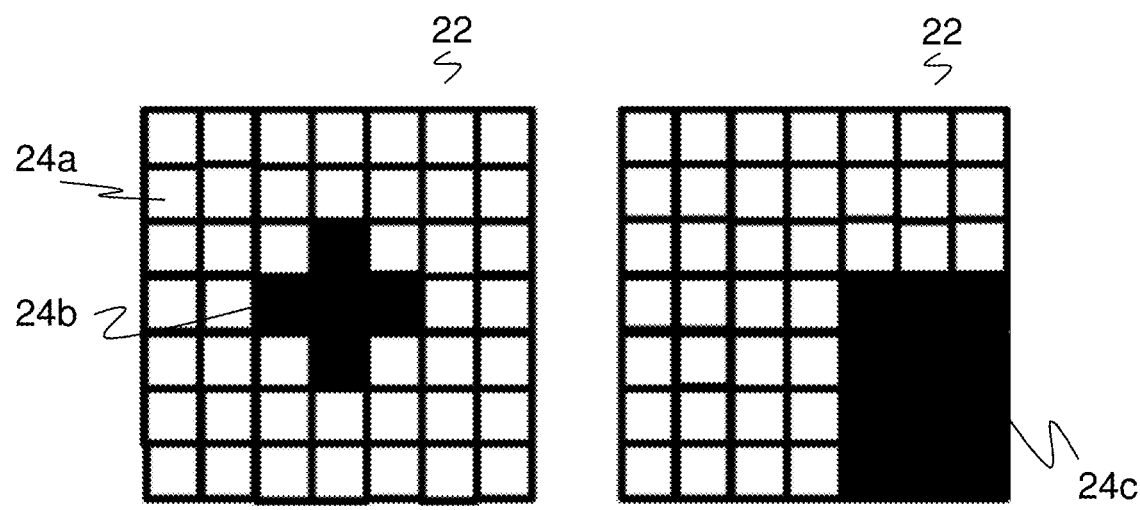
Figure 7:
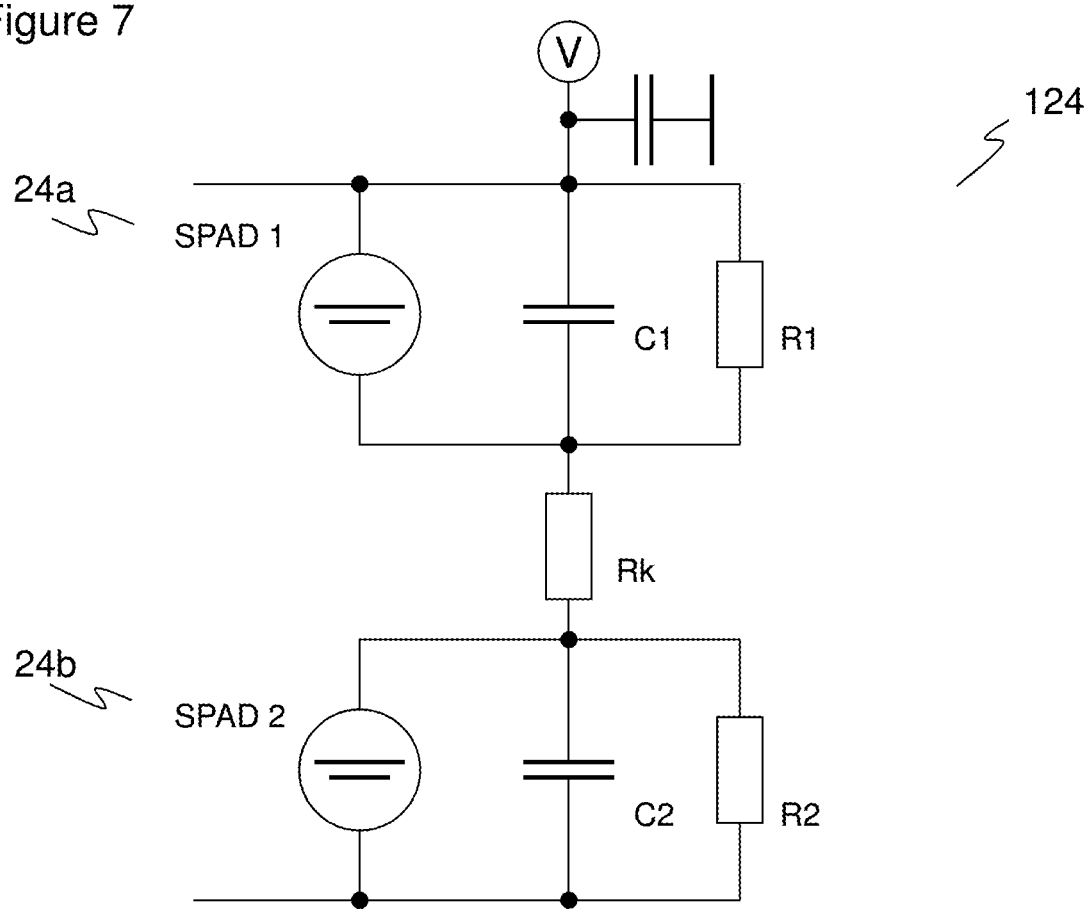
Figure 8:
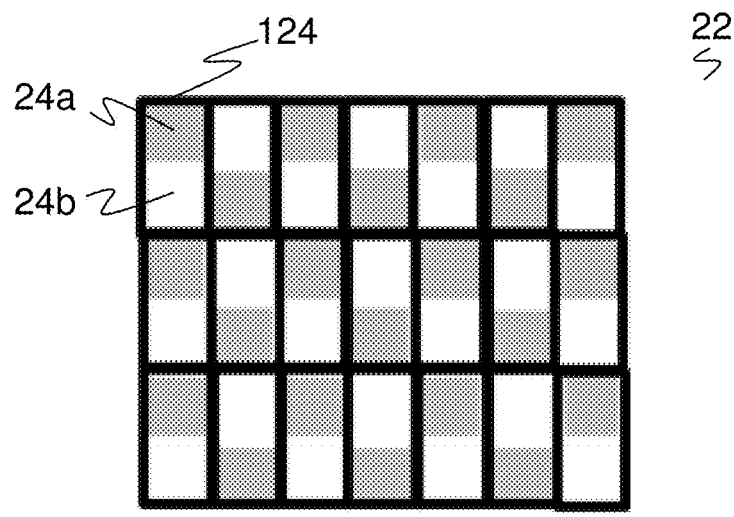
Figure 9:
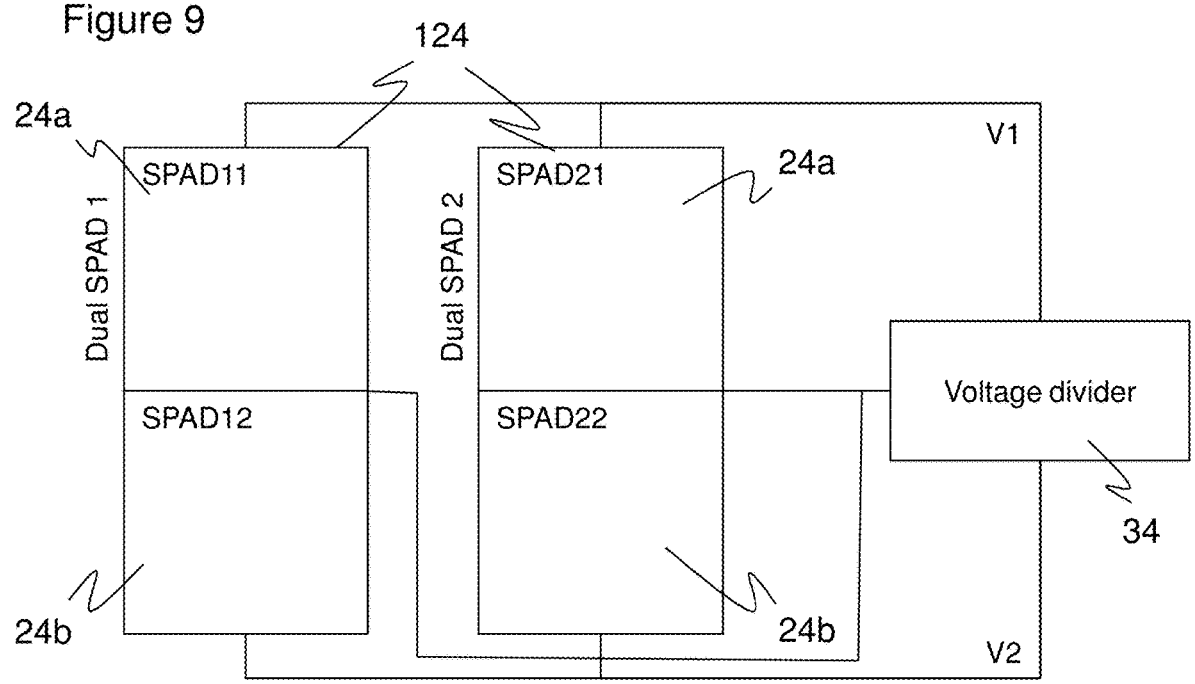

The invention will be explained in more detail in the following also with respect to further features and advantages by way of example with reference to embodiments and to the enclosed drawing. The Figures of the drawing show in:

FIG. 1 a schematic representation of an optoelectronic sensor with a light receiver having a plurality of avalanche photodiode elements in Geiger mode;

FIG. 2 representations of a received pulse only partly detected due to dead times;

FIG. 3 a schematic representation of an alternating time activation of avalanche photodiode elements in a kind of checkerboard pattern;

FIG. 4 a representation of a received pulse that can be completely detected by consecutively activated groups of avalanche photodiode elements;

FIG. 5 a schematic representation of a grid division of groups of avalanche photodiode elements with sequential activation;

FIG. 6 examples of other patterns of consecutively active avalanche photodiode elements;

FIG. 7 a schematic circuit representation of a dual avalanche photodiode with two avalanche photodiode elements in which an avalanche effect in the one avalanche photodiode element changes the sensitivity of the other avalanche photodiode element;

FIG. 8 a representation of an alternating temporal activation in a kind of checkerboard pattern similar to FIG. 3, but with dual avalanche photodiodes in accordance with FIG. 7; and FIG. 9 a schematic representation of a plurality of dual avalanche photodiodes connected in parallel with a voltage divider.

FIG. 1 shows a schematic representation of an optoelectronic sensor 10 in an embodiment as a single-beam light scanner. A light transmitter 12, for example an LED or a laser light source, transmits a light signal 14 into a monitored zone 16. If it is incident on an object 18 there, some of the light signal is remitted or reflected and returns to a light receiver 22 as a remitted light signal 20. This light receiver 22 comprises a plurality of avalanche photodiode elements 24 in Geiger mode or SPADs. The received signals of the avalanche photodiode elements 24 are read by a control and evaluation unit 26 and are evaluated there.

In the representation, two blocks of the control and evaluation unit 26 are emphasized only very schematically and purely on a functional plane, namely a time of flight measurement unit 28 and a control unit 30. The time of flight measurement unit 28 measures a time of flight from the transmission of the light signal 14 to the reception of the remitted light signal 20 and converts it into a distance via the speed of light. The time of flight measurement unit 28 is not present if the sensor 10 has a different purpose than a distance determination using a time of flight process. The control unit 30 is able to change the sensitivity of the avalanche photodiode elements 24 groupwise as will be explained in detail further below.

The sensor 10 has further elements in a practical embodiment, in particular transmission and reception optics and connectors that will not be looked at here for reasons of simplicity. The separation into light receiver 22 and control and evaluation unit 26 in FIG. 1 is also conceivable in practice, but primarily serves for explanation. At least some of these elements are preferably integrated on a common chip whose surface is shared by light sensitive regions of the avalanche photodiode elements 24 and circuits associated with individual avalanche photodiode elements 24 or groups of avalanche photodiode elements 24 for their evaluation and control.

In addition, the optical arrangement with a light transmitter 12 that covers a small portion of the light receiver 22 is purely by way of example. Alternatively, other known optical solutions can also be used such as autocollimation, for instance with a beam splitter and a common optical system, or pupil division where two separate optical systems are provided and the light transmitter and the light receiver are arranged next to one another.

The single-beam sensor 10 shown is also only to be understood as an example overall. An expansion of the monitored zone 16 is possible by moving the beam in a laser scanner, either by a rotating mirror or by a measurement head having a light transmitter 12 and/or a light receiver 22 and rotating as a whole. A plurality of single-beam systems can thus be combined with one another to form a light grid that has a plurality of mostly parallel beams and that in particular measures or monitors distances as a scanning light grid in each beam. Measurements can be made individually or groupwise with spatial resolution using the avalanche photodiode elements 24 so that a 3D camera is created. Mobile systems are also conceivable in which the sensor 10 is movably installed.

FIG. 2 shows three representations of the time progression of a cumulative received signal of the avalanche photodiode elements 24 over one another in the region of a strong received pulse. The number of triggering avalanche photodiode elements 24 is applied against the time for this purpose. The total received pulse is shown in the upper part of FIG. 2; a no longer received residue of the received pulse in the middle part; and in a complementary manner the received initial region of the received pulse in the lower part.

With a strong received pulse, its photons from an initial region namely already trigger all the available avalanche photodiode elements 24 so that the total light receiver 22 effectively moves into saturation. During the incidence of the rear portion of the received pulse, all or almost all the avalanche photodiode elements 24 are then in their dead times and can no longer respond to the photons of the remaining received pulse.

On a real measurement, the pulse shape now does not have such a clear resolution and separation as in the lower part of FIG. 2 so that a determination of the reception time point cannot simply be based on the there non-displaced maximum value. With a realistic time of flight measurement that, for example, determines the focus, an erroneous pulse reconstruction rather takes place. This produces an error in the time of flight measurement that depends on the intensity of the received pulse and on the dead time of the avalanche photodiode elements 24. This systematic error is a particular characteristic of the black-and-white displacement or of the intensity-dependent light/dark error long known for time of flight measurements, according to which bright objects 18 are measured at a different distance than dark objects 18, now in Geiger mode in the case of avalanche photodiode elements 24.

A possible application of a groupwise setting of sensitivities of the avalanche photodiode elements 24 in a time sequence by means of the control unit 30 is to avoid this systematic error and to enable an intensity-independent, correct reconstruction of the received pulse.

For this purpose, two alternating groups of avalanche photodiode elements 24a-b are formed in a first embodiment in accordance with FIG. 3 that are arranged to form a checkerboard pattern on the light receiver 22. As shown in the left part of FIG. 3, the avalanche photodiode elements 24a of the first group are active (black) first and the avalanche photodiode elements 24b of the second group are inactive (white). The configuration is changed with a defined time offset; now, as in the right part of FIG. 3, the avalanche photodiode elements 24b of the second group are active (black) and the avalanche photodiode elements 24b of the first group are inactive (white). The control unit 30 can carry out this change once or multiple times in a regular or irregular sequence.

If now a strong received pulse is incident on the light receiver 22, at most all the currently active avalanche photodiode elements 24a or 24b are triggered and are thereby non-sensitive during the subsequent dead time. After the change, the other group of now active avalanche photodiode elements 24b or 24a, that are not in their dead times, is ready for a detection.

The checkerboard pattern shown in FIG. 3 is only a simple example. Generally, let the n×m avalanche photodiode elements 24 of the light receiver 22 be unambiguously addressable by a numerical pair (i,j), 1≤i≤n, i≤j≤m. l time windows $\Delta tk$, 1≤k≤l of any respective length are now determined and a matrix having the coefficients $a_k(i,j)$ is predefined at each time window $\Delta tk$ for the sensitivity of the avalanche photodiode element 24 at the position (i,j). The coefficients a(i,j) are preferably standardized between a minimal and a maximum sensitivity and selectively only adopt the digital values (0,1) for active and inactive or intermediate values for sensitivities. Such intermediate values are preferably set by means of the value of an overvoltage above the breakdown voltage in avalanche photodiode elements 24. For example, the value 0 stands for below the breakdown voltage and the value 1 stands for a comfortable working voltage well above the breakdown voltage whose further increase would hardly change the sensitivity. The overvoltage is correspondingly scaled for values between 0 and 1.

New groups of avalanche photodiodes 24, that in the extreme case respectively only consist of one avalanche photodiode 24, are formed in the last-described manner in each time window $\Delta tk$. For a clearer procedure, only some groups are preferably formed whose group affiliation is maintained over time and only the sensitivity of the avalanche photodiode elements 24 of a group are changed at specific points in time. A single control admittedly offers the greatest flexibility, but the effort, in particular for the additional lines to each avalanche photodiode element 24, is high and reduces the fill factor. With a fixed group affiliation, in contrast, common controls and lines can be used.

FIG. 4 illustrates a further embodiment. A received pulse is again shown in a manner similar to FIG. 2. The time window of the expected duration of the received pulse is divided, here, for example, regularly and into six part sections $\Delta t1$-$\Delta t6$. In each of these time windows $\Delta t1$-$\Delta t6$, a respective different one of six groups of avalanche photodiode elements 24 is activated so that a population of detection-ready avalanche photodiode elements 24 in which no avalanche effect has yet been triggered and which are not in their dead times is available over the total duration of the received pulse. The common triggering at a high light load or at high intensity gradients as in FIG. 2 is thus avoided. The electrical received pulse reconstructed from the received signal of the avalanche photodiode elements 24 does not have any displaced focus; its pulse shape is rather realistically reproduced and the black-and-while defect is thus suppressed.

FIG. 5 shows a matching possible distribution of the groups of avalanche photodiode elements 24 formed with respect to the part sections $\Delta t1$-$\Delta t6$ on the light receiver 22. In this respect, the light receiver 22 is divided into a regular grid of matrix elements 32 of which only one is emphasized by way of example by a thicker line in FIG. 5. At least one avalanche photodiode element 24 of each group, as symbolized by numbers 1 . . . 6, is provided within each matrix element 32. In the part section $\Delta t1$, the avalanche photodiode elements 24 are thus active at number 1 and, correspondingly for the further part sections $\Delta t2$-$\Delta t6$, the avalanche photodiode elements 24 are active at numbers 2 . . . 6. It would differently from this be conceivable to vary the arrangement of the groups symbolized by the numbers 1 . . . 6 over the matrix elements 32. In another respect, the embodiment illustrated by FIG. 5 can be understood as a generalization of the embodiment illustrated in FIG. 3 having a checkerboard pattern of two by six and analogously a different number of groups.

The duration of the part sections $\Delta t1$-$\Delta t6$ is advantageously summed approximately to the expected duration of the received pulse. The individual durations $\Delta t1$-$\Delta t6$ and the sequence can be uniform, but can also be varied. A time overlap would also be conceivable in which at least one group is still active while the next group is already being activated. The control sequence is preferably repeated in accordance with any desired periodic pattern to cover an unknown temporal position of the received pulse and it can be synchronized with the transmission time point of the light signal 14.

The selected number of six part sections $\Delta t1$-$\Delta t6$ or of six groups is only an example. It is, however, sensible not to form too many groups and in particular to form at most ten groups so that a sufficient number of avalanche photodiode elements 24 is still contained in each group. Otherwise, a weaker received pulse from a distant and/or dark object 18 would possibly no longer even be detected with too few avalanche photodiode elements 24, particularly since typically a received light spot from the far region only illuminates a small part of the light receiver 22 and thus most avalanche photodiode elements 24 do not receive any useful light photons at all even at very high sensitivity. A small received light spot from the far region can, however, also be avoided by a homogenizing optics such as described in DE 10 2014 102 420 A1, whereby the total light receiver 22 is, where possible, illuminated uniformly independently of the distance.

These parameters are preferably considered in the design of the specific activation sequence and of the arrangement of avalanche photodiode elements 24 into groups for a specific application: The photon stream, the number of avalanche photodiode elements 24 available overall, their photon detection efficiency (PDE), and their dead times.

FIG. 6 again illustrates that not only the specifically described grid-like or checkerboard-like patterns are available for such a design, but in principle also any desired arrangements. As in FIG. 3, the avalanche photodiode elements 24 active at the point in time looked at are black, the inactive avalanche photodiode elements 24 are shown as white. There can also be avalanche photodiode elements 24 that do not belong to any group and are always active, always inactive, or always set to a specific sensitivity. On the other hand, such avalanche photodiode elements 24 do not have to be looked at separately at all in that they are considered as a further group that are set to the desired sensitivity, for instance on the switching on, at the point in time zero.

FIG. 7 shows a schematic circuit with respect to an advantageous embodiment. Two respective avalanche photodiode elements 24a-b are here interconnected to form a dual avalanche photodiode 124, and indeed such that the triggering of an avalanche effect in the one avalanche photodiode element 24-b with a selectable time offset has the consequence of a change of the sensitivity, in particular an activation or deactivation of the other avalanche photodiode element 24b-a. The switching elements shown are so-to-say the control unit 30 that is fully or partly integrated in the dual avalanche photodiode 124 and that derives the point in time for a change of the sensitivity dynamically from an avalanche effect. The two avalanche photodiode elements 24a-b advantageously share a charge resistor Rk.

The two avalanche photodiode elements 24a-b are also in part called the front avalanche photodiode element 24a and the rear avalanche photodiode element 24b. This is, however, only a linguistic simplification that is based on the time sequence in a preferred embodiment. In other embodiments, the rear avalanche photodiode elements 24b can also be active first and can activate the front avalanche photodiode elements 24a, the one avalanche photodiode element 24a-b can temporarily suppress the activity of the other avalanche photodiode element 24b-a, or both avalanche photodiode elements 24a-b are simultaneously active with the same or different sensitivities, with the sensitivity of the partners being changed directly after an avalanche effect.

The schematic circuit of FIG. 7 will be explained using a numerical example. With an assumed breakdown voltage of 28 V, 57 V are available as a common supply voltage V. They are unevenly distributed over the voltage divider circuit formed by the resistors R1 and R2, namely 30 V above the breakdown voltage for the front avalanche photodiode element 24a and 27 V below the breakdown voltage for the rear avalanche photodiode element 24b. Matching values for the resistors could be R1=300 K and R2=270 K.

If now the dual avalanche photodiode 124 is illuminated, only the front avalanche photodiode element 24a that is biased above the breakdown voltage reacts thereto since the rear avalanche photodiode element 24b does not work in the Geiger mode and is to be considered inactive in a relative comparison. Due to the avalanche effect in the front avalanche photodiode element 24a it becomes low ohmic and the voltage drop over the rear avalanche photodiode element 24b increases, drives its bias voltage above the breakdown voltage and thus controls it into the Geiger mode or activates it.

Other numerical values for the resistors R1 and R2, thus a different voltage division ratio, and for the common supply voltage selectively result in different overvoltages and thus sensitivities, for instance to reproduce a large dynamic range. An avalanche effect in the one avalanche photodiode element 24a-b then makes the other avalanche photodiode element 24b-a even more sensitive due to higher overvoltage. It can be achieved by a modification of the interconnection in accordance with FIG. 7 that an avalanche effect in the one avalanche photodiode element 24a-b instead makes the other avalanche photodiode element 24b-a less sensitive or even sets it to inactive. The one avalanche photodiode element 24a-b is thus so-to-say temporarily protected by the avalanche effect of the other avalanche photodiode element 24b-a, particularly at a high light incidence, so that a detection-capable avalanche photodiode element 24a-b still remains afterward during the dead time.

FIG. 8 shows an exemplary, checkerboard-like arrangement of dual avalanche photodiodes 124. Every second avalanche photodiode 124 is so-to-day upside down here. Otherwise a stripe pattern would result, which is alternatively conceivable since the respective spatial deviation by a maximum of the extent of an avalanche photodiode element 24a-b is small. A time sequence of the activity is in any case made possible without an external control by this principle of a pattern by dual avalanche photodiodes 124 so that in particular the above-named advantages of an improved reconstruction of a received pulse and ultimately the compensation of a light-dark error are achieved in a particularly simple manner. The front avalanche photodiode elements 24a and the rear avalanche photodiode elements 24b here each form one of two groups, in a similar manner as in FIG. 3, with the difference that in the dual avalanche photodiodes 124, the respective rear avalanche photodiodes 24b are not activated together as a group, but rather individually in response to an avalanche effect.

The pattern shown in FIG. 8 is only an example. Apart from other arrangements, a combination with individual, non-dual avalanche photodiode elements 24 is also conceivable that in particular form groups as described above with respect to FIGS. 2 to 6. The concept of a dual interconnection of two avalanche photodiode elements 24a-b can also be expanded to k-fold avalanche photodiodes k≥3. A further variation possibility comprises different avalanche photodiode elements 24a-b, for instance with light-sensitive surfaces of different sizes, being interconnected to form a dual avalanche photodiode 124.

FIG. 9 shows an example for a parallel connection of a plurality of dual avalanche photodiodes 124. If required, in a variant every second dual avalanche photodiode 124 can be turned upside down. Unlike in FIG. 7, the bias voltage is here not distributed individually per dual avalanche photodiode 124 over the respective two avalanche photodiode elements 24a-b. Instead, a plurality of dual avalanche photodiodes 124 are connected in parallel, in particular all the dual avalanche photodiodes 124 of a row or column, and are supplied via a common voltage divider 34. The voltage divider 34 can alternatively be configured so that the two avalanche photodiode elements 24a-b trigger one another in the reverse order so that the dual avalanche photodiode 124 is, so-to-say "upside down". In an arrangement of a plurality of dual avalanche photodiodes 124, such "upside down" dual avalanche photodiodes 124 and "not upside down" dual avalanche photodiodes 124 can be mixed as desired.

In addition, the voltage ratio is preferably variable to, for example, bias the avalanche photodiode elements 24a-b with different overvoltages and a voltage below the breakdown voltage. With a breakdown voltage of 28 V still assumed purely by way of example, the variation range could be at 26 V . . . 35 V or more.

The desired sensitivity or the time delay between the avalanche effect and the activation of the partner in the dual avalanche photodiode 124 can thereby be controlled from outside. A variable setting of the voltage divider ratio or a setting of the voltage divider ratio variable from outside is also conceivable without a parallel connection of a plurality of dual avalanche photodiodes 124 for only one individual dual avalanche photodiode 124 as in FIG. 7.

The dual avalanche photodiodes 124 can also be operated at high frequencies up to and into the gigahertz range on a use of a suitable reading circuit such as is presented in EP 3 124 992 B1.

The invention claimed is:

1. A light receiver comprising:
a plurality of avalanche photodiode elements that can each be biased above a breakdown voltage by a bias voltage and can thus be operated in a Geiger mode, wherein the avalanche photodiode elements form a plurality of groups; and a control unit to change the sensitivity of the avalanche photodiode elements of a respective group, wherein the control unit is configured to respectively change the sensitivity of the avalanche photodiode elements of a group at at least one point in time assigned to the group, with different points in time being assigned to the groups, wherein two respective avalanche photodiode elements from two different groups of the plurality of avalanche photodiode elements form an at least dual avalanche photodiode having at least one front avalanche photodiode element and one rear avalanche photodiode element, wherein an avalanche effect of the at least one front avalanche photodiode element changes the sensitivity of the rear avalanche photodiode element, or vice versa.

2. The light receiver in accordance with claim 1, wherein the control unit is configured to activate avalanche photodiode elements by increasing the bias voltage above the breakdown voltage.

3. The light receiver in accordance with claim 1, wherein the control unit is configured to deactivate avalanche photodiode elements by decreasing the bias voltage below the breakdown voltage.

4. The light receiver in accordance with claim 1, wherein the control unit is configured to change the sensitivity by an overvoltage assigned to the group above the breakdown voltage.

5. The light receiver in accordance with claim 1, wherein a time of flight measurement unit is provided that is configured to determine a time of flight of a light pulse from the signals of the avalanche photodiode elements.

6. The light receiver in accordance with claim 1, wherein the points in time define at least one adaptation time window per group at whose start the control unit sets the avalanche photodiode elements to a sensitivity assigned to the group and at whose end the control unit sets the avalanche photodiode elements to the previous sensitivity.

7. The light receiver in accordance with claim 1, wherein the points in time with respect to the different groups are distributed over an event time window.

8. The light receiver in accordance with claim 7, wherein the event time window has a duration corresponding to a light pulse.

9. The light receiver in accordance with claim 1, wherein the points in time are distributed such that the avalanche photodiode elements of a different group are respectively alternatingly particularly sensitive.

10. The light receiver in accordance with claim 9, wherein the points in time are distributed such that the avalanche photodiode elements of a different group are respectively alternatingly particularly sensitive with a periodic repetition.

11. The light receiver in accordance with claim 1, wherein the avalanche photodiode elements form a matrix arrangement; and wherein each group has at least one avalanche photodiode element in each matrix element in a subdivision of the matrix arrangement into a grid of matrix elements.

12. The light receiver in accordance with claim 1, wherein the avalanche photodiode elements of two groups form a checkerboard pattern.

13. The light receiver in accordance with claim 1, wherein the avalanche effect provides a changed bias voltage at the rear avalanche photodiode element, or vice versa.

14. The light receiver in accordance with claim 1, wherein the dual avalanche photodiode has an interconnection unit associated with it that holds the front avalanche photodiode element at a bias voltage above the breakdown voltage and holds the rear avalanche photodiode element at a bias voltage below the breakdown voltage in the state of rest before an avalanche effect, or vice versa.

15. The light receiver in accordance with claim 14, wherein the interconnection unit has a voltage divider circuit.

16. The light receiver in accordance with claim 1, wherein a delay circuit is provided that activates or deactivates the rear avalanche photodiode element after a predefinable delay time after an avalanche effect in the front avalanche photodiode element, or vice versa.

17. An optoelectronic sensor having at least one light receiver, wherein the light receiver comprises a plurality of avalanche photodiode elements that can each be biased above a breakdown voltage by a bias voltage and can thus be operated in a Geiger mode, wherein the avalanche photodiode elements form a plurality of groups, and a control unit to change the sensitivity of the avalanche photodiode elements of a respective group, wherein the control unit is configured to respectively change the sensitivity of the avalanche photodiode elements of a group at at least one point in time assigned to the group, with different points in time being assigned to the groups, wherein the optoelectronic sensor has a light transmitter for transmitting a light signal and has a time of flight measurement unit that is configured to determine a distance of the object from a time of flight between the transmission of the light signal and the reception of the light signal remitted by an object from a monitored zone, and wherein two respective avalanche photodiode elements from two different groups of the plurality of avalanche photodiode elements form an at least dual avalanche photodiode having at least one front avalanche photodiode element and one rear avalanche photodiode element, wherein an avalanche effect of the at least one front avalanche photodiode element changes the sensitivity of the rear avalanche photodiode element, or vice versa.

18. The optoelectronic sensor in accordance with claim 17, wherein the sensor is a distance-measuring sensor.

19. A method of detecting light using a plurality of avalanche photodiode elements that are each operated at least phase-wise at a bias voltage above a breakdown voltage and thus in a Geiger mode, wherein the avalanche photodiode elements form a plurality of groups and the sensitivity of the avalanche photodiode elements of a respective group is changed, the method comprising respectively changing the sensitivity of the avalanche photodiode elements of a group at at least one point in time assigned to the group, with different points in time being assigned to the groups, and wherein two respective avalanche photodiode elements from two different groups of the plurality of avalanche photodiode elements form an at least dual avalanche photodiode having at least one front avalanche photodiode element and one rear avalanche photodiode element, wherein an avalanche effect of the at least one front avalanche photodiode element changes the sensitivity of the rear avalanche photodiode element, or vice versa.

\* \* \* \* \*